United States Patent
Sugg et al.

(10) Patent No.: US 6,573,581 B1
(45) Date of Patent: Jun. 3, 2003

(54) REDUCED DARK CURRENT PIN PHOTO DIODES USING INTENTIONAL DOPING

(75) Inventors: Allan Richard Sugg, Langhorne, PA (US); Michael John Lange, Yardley, PA (US); Martin Harris Ettenberg, Princeton, NJ (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/762,487

(22) PCT Filed: Feb. 16, 2000

(86) PCT No.: PCT/US00/03935
§ 371 (c)(1), (2), (4) Date: Feb. 7, 2001

(87) PCT Pub. No.: WO00/52766
PCT Pub. Date: Sep. 8, 2000

Related U.S. Application Data
(60) Provisional application No. 60/122,188, filed on Mar. 1, 1999.

(51) Int. Cl.$^7$ ............... H01L 29/78; H01L 33/00
(52) U.S. Cl. ................................ 257/451; 257/458
(58) Field of Search .......................... 257/451, 458

(56) References Cited

U.S. PATENT DOCUMENTS
5,371,399 A * 12/1994 Burroughes et al.

* cited by examiner

*Primary Examiner*—Stephen D. Meier
(74) *Attorney, Agent, or Firm*—Woodbridge & Associates, PC; Richard C. Woodbridge

(57) ABSTRACT

In a semiconductor p-i-n photodiode an undoped absorption region (10) is epitaxially grown between two highly doped regions (14, 16). In prior art lattice matched InGaAs p-i-n photodiodes current epitaxial structures use low InP cap (16) doping (n~$2.5-6\times10^{16}$/cm$^3$), and nominally undoped (not intentionally doped, n~$1\times10^{13}-5\times10^{14}$/cm$^3$) InGaAs absorption regions (10). The shunt resistances of p-i-n photodiodes according to the present invention with intentional doping between n~$5\times10^{17}$/cm$^3$ and $1\times10^{14}$/cm$^3$, in the InGaAs absorption region (52, 60) are significantly increased over that of a standard structure (non-intentionally doped).

11 Claims, 6 Drawing Sheets

| STRUCTURE | Ro(ohms) | Id(50mv) | Id(100mV) | Id(250mV) | Id(500mV) |
|---|---|---|---|---|---|
| SAMPLE A | 1.6e9 | 1.7e-11 | 2.1e-11 | 2.7e-11 | 3.6e-11 |
| SAMPLE B | 6.5e9 | 6.7e-12 | 9.0e-12 | 1.5e-11 | 2.6e-11 |
| SAMPLE C | 7.6e9 | 2.88e-12 | 4.61e-12 | 1.0e-11 | 2.1e-11 |

REDUCED DARK CURRENT PIN PHOTO DIODES USING INTENTIONAL DOPING

CROSS REFERENCE TO RELATED APPLICATIONS

This application claims the priority date of PCT Application PCT/US00/0395 filed Feb. 16, 2000 entitled "Doped Structures For Improved InGaAs Performance In Imaging Devices" which claimed priority from U.S. Provisional Patent Application Serial No. 60/122,188 filed Mar. 1, 1999 entitled "Reduced Dark Current p-i-n Photo Diodes Using Intentional Doping" the entire content and substance of which is incorporated by reference.

BACKGROUND OF THE INVENTION

1. Field of the Invention

This invention relates to a device for detecting light in the near infrared spectrum utilizing lattice matched InGaAs.

2. Description of Related Art

Photodetectors made of InGaAs lattice matched to InP have been used in many applications from spectroscopy to imaging (M. J. Cohen and G. H. Olsen "Near-IR Imaging Cameras Operate at Room Temperature," Laser Focus World 27,21 (1991)) to communications (H. Haupt, "InP-based components for telecom systems in Europe", *Proc. of the Ninth International Conference on Indium Phosphide and Related materials, Cape Cod, Mass.*, 3 (1997)). This material detects light from 0.9–1.7 μm. It has been fabricated into single element detectors, 1-D linear arrays up to 512 elements long, and 2-D arrays as large as 320×240 elements. (G. H. Olsen, "InGaAs fills the near-IR detector-array vacuum", Laser Focus World,27,21(1991), M. H. Ettenberg, M. Lange, A. R. Sugg, M. J. Cohen, and G. H. Olsen, "A 2 μm cutoff 320×240 InGaAs NIR camera", *Proc. Of 11$^{th}$ annual IEEE Lasers and Electro-Optics Society, Orlando, Fla.*, 1092–8081, 71 (1998). The 1-D and 2-D arrays are generally hybridized to Read Out Integrated Circuits (ROIC). These ROIC integrate signal over time. The ROIC does not differentiate between photocurrent and darkcurrent from the detector.

The ROIC applies a limited amount of reverse bias to the detector. Some ROIC's operate near zero bias (±3 mV) others run as high 5V. The ROIC have storage capacitors at each pixel location and they have limited space for storing charge. Dark current is produced by the detector when it is placed in reverse bias. It is current produced by the device without the device being illuminated. The smaller the amount of dark current produced by the detector allows for larger amounts of photocurrent to be collected before the capacitor fills in the ROIC. This leads to a larger signal-to-noise ratio. It is the goal of the present invention to minimize the amount of dark current produced by the diode at a given applied bias.

Most InGaAs lattice matched to InP is used in the communications industry. InGaAs is capable of detecting 1.55 μm light, which is commonly used in fiber optic communication. The standard photodetector used in these applications is the p-i-n InGaAs structure. Detectors used in fiber optic communications require high speeds. To have fast devices the RC time constant needs to be minimized. If one lowers the doping density of the absorption region in the p-i-n structure, one lowers the capacitance of the device. InGaAs p-i-n diodes are fabricated using epitaxial methods and the lowest doping possible is defined as the background doping or residual doping of the epitaxial method. Much work has been conducted to reduce the background doping and impurities from this layer to make it as pure as possible. Traditionally the InGaAs absorption region is left undoped, with a resulting background doping on the order of $10^{13}$–$10^{15}/cm^3$. (R. D. Dupis, J. C. Campbell, and J. R. Velebir, "InGaAs/InP Photodiodes Grown by Metalorganic Chemical Vapor Deposition", J. of Cryst. Growth, 77 595–605 (1986).)

The following U.S. patents may be generally relevant to the state of the art and the present inventions.

U.S. Patents entitled "PIN Photodiode Having a Low Leakage Current" (U.S. Pat. No. 4,904,608) and "PIN Photodiode Having a Low Leakage Current" (U.S. Pat. No. 4,999,696) both describe methods to fabricate a low leakage current photodiode in a MESA structure, which is very different from the planar devices described in this disclosure. The patent disclosure stresses that the doping of the layers should be optimum for lowering the capacitance which is equivalent to minimizing the doping in the intrinsic region.

U.S. Patent entitled "Semiconductor Structure for Photodetector" (U.S. Pat. No. 5,214,276) describes a photodetector made of InGaAs but focuses on preventing stray light from entering the diode.

U.S. Patent entitled "Multi-Layered Semi-Conductor Photodetector" (U.S. Pat. No. 4,682,196) describes a structure for making high speed, low dark current devices. This is a very different structure from the structure discussed in this disclosure and it stresses that the intrinsic region should be doped as low as possible.

U.S. Patent entitled "Low Leakage Current Photodetector Arrays" (U.S. Pat. No. 5,387,796) describes a method to lower the dark current in non-lattice matched material. In non-lattice matched material the main issue is stress relief due to lattice mismatch between the epitaxial layers and the substrate it is grown on. According to the prior art, p-i-n structures are generally specified to have no intentional doping. They are grown by epitaxy from either the liquid phase or the vapor phase by many methods. In the prior art the doping is described as similar to this disclosure $\sim 1 \times 10^{15}/cm^3$, but this was achieved utilizing residual doping. The doping of the layers was not intentional. This residual doping was the lowest achievable doping at the time of the prior art. (M. J. Robertson, S. Ritchie, S. K. Sargood, A. W. Nelson, L. Davis, R. H. Walling, C. P. Skrimshire, R. R. Sutherland, "Highly Reliable Planar GaInAs/InP Photodiodes With High Yield Made By Atmospheric Pressure MOVPE", *Electron. Lett.*, 24, 5 (1988)). In all of the prior art the material is described as "undoped".

In the prior art low doping allows the intrinsic region to be thick enough to collect all of the light, yet be fully depleted at operating biases so as to minimize the capacitance. The result being high speed (GHz) operation. In the communications industry the dark current of the detector is not critical, speed is the critical factor. In applications where an ROIC is used, the devices speed is no longer critical, the amount of dark current becomes the critical factor. Devices that are hybridized integrate signal over time and thus the device does not run at high speeds. Without the need for high speed, the removal of the dopants and impurities from the absorption layer may not be the best solution.

SUMMARY OF THE INVENTION

Briefly described, the invention comprises an $In_{0.53}Ga_{0.47}As$ p-i-n diode. The shunt resistance $R_0$ can be increased by intentionally doping the InGaAs absorption region. According to the present invention, n-type dopants are intentionally introduced at concentration levels between $1\times10^{14}$ to $5\times10^{17}/cm^3$ in the absorption region of a p-i-n diode. This doping level decreases the dark current at the operating voltages of the ROIC. Lowering of the dark current allows for greater gain from the devices or better signal-to-noise ratio from the device.

The main focus of the invention is to reduce dark current. Higher doping would be unacceptable in traditional high speed InGaAs p-i-n diodes. The increased doping lowers the breakdown voltage and increases the device capacitance lowering its bandwidth. For the relatively slow, low bias conditions used in video-rate imagers and spectroscopy applications these are not relevant. It has been discovered that it is better to intentionally dope the absorption layer to a given concentration for lower dark current in these array type devices.

The invention may be more fully understood by references to the following drawings.

DETAILED DESCRIPTION OF THE INVENTION

During the course of this description like numbers will be used to identify like elements according to the different views which illustrate the invention.

Figure 1:
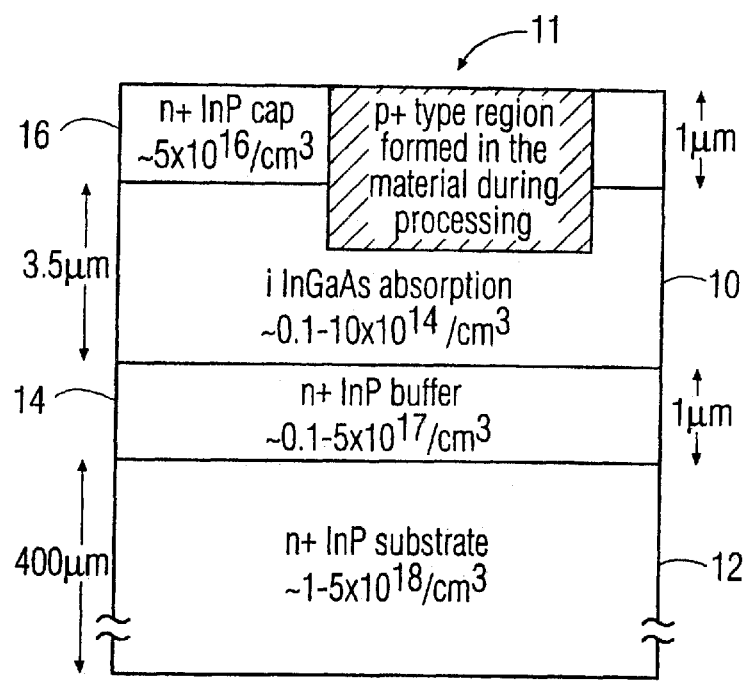
FIG. 1 illustrates a standard prior art lattice matched p-i-n diode used for the communication industry.

The standard prior art lattice matched $In_{0.53}Ga_{0.47}As$ photodetector used in imaging as well as communication applications is the p-i-n InGaAs structure, found in FIG. 1. It is commonly called lattice matched InGaAs because the lattice constant of the $In_{0.53}Ga_{0.47}As$ 10 is the same as the InP substrate 12 it is grown on. The starting substrate is n+ InP 12 on which approximately 1 μm of InP n+ 14 is grown. Layer 14 acts as a buffer layer for the rest of the epitaxial growth. The InGaAs absorption layer is grown on top of the buffer layer and is generally 3–4 μm thick 10. The InGaAs absorption region is undoped, with a residual background n-type doping in the range of $10^{13}$–$10^{15}/cm^3$ 10. The structure is completed by growing a 1 μm–1.5 μm n+ layer of InP 16 on top of the InGaAs. The epitaxy is grown by one of many techniques including vapor phase epitaxy, metal organic chemical vapor deposition, liquid phase epitaxy, or molecular beam epitaxy on the InP substrates.

The p-i-n diode is formed during the manufacturing process. A volume of material is changed from n-type to p-type material through diffusion or ion implantation of a p-type dopant, i.e. zinc 11. This process has been well characterized in the literature. (R. Klockenbrink, E. Peiner, H. H. Wehmann, and A. Schlachetzki, "Area-Selective Diffusion of Zn in $InP/In_{0.53}Ga_{0.47}As/InP$ for Lateral pn Photodiodes", *J. Electochem. Soc.* (142), Mar. 3, 1995.) Doping only a selected region of the material allows the fabrication of an isolated p-i-n diode. These can be fabricated as individual p-i-n diodes on a common substrate, which allows the fabrication of 1-D and 2-D arrays of detectors.

To determine what doping density in the absorption region would optimize the device characteristics, two structures were fabricated with a wide range of doping conditions. All of the wafers were grown by atmospheric pressure MOCVD and obtained from a commercial epitaxial material vendor. Three wafers were grown under similar conditions:

Sample A (FIG. 1) was grown with an undoped absorption region 10 and served as a control for the experiment.

Figure 2:
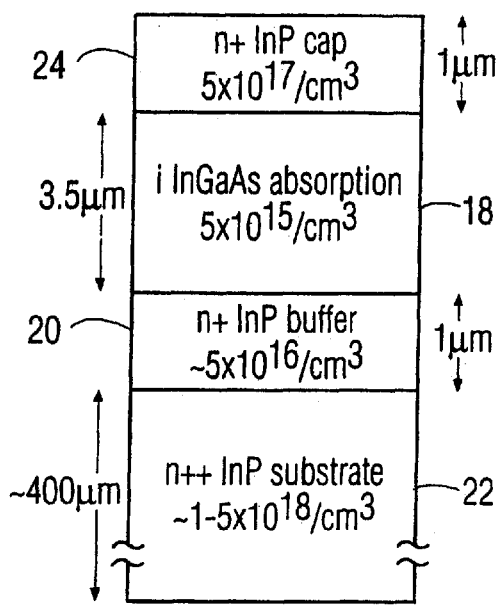
FIG. 2 illustrates a lattice matched p-i-n epitaxial structure before processing used in experiments with a small quantity of intentionally doping in the absorption region.

Sample B (FIG. 2) was doped in the absorption region to $5\times10^{15}/cm^3$ 18.

Figure 3:
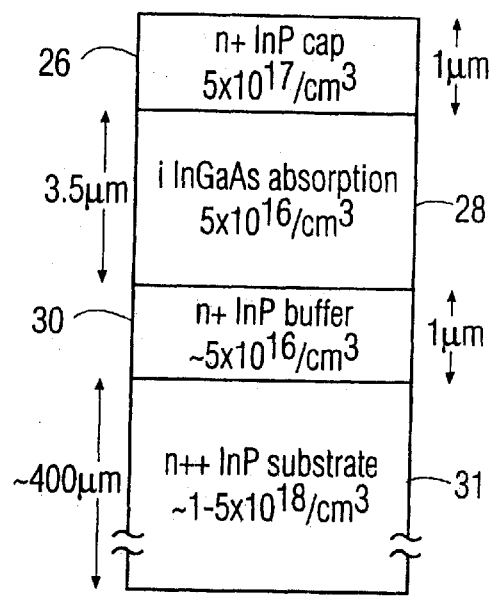
FIG. 3 illustrates a lattice matched p-i-n epitaxial structure before processing used in experiments with a large quantity of intentional doping.

Sample C (FIG. 3) was doped in the absorption region to $5\times10^{16}/cm^3$ 28.

Figure 4:
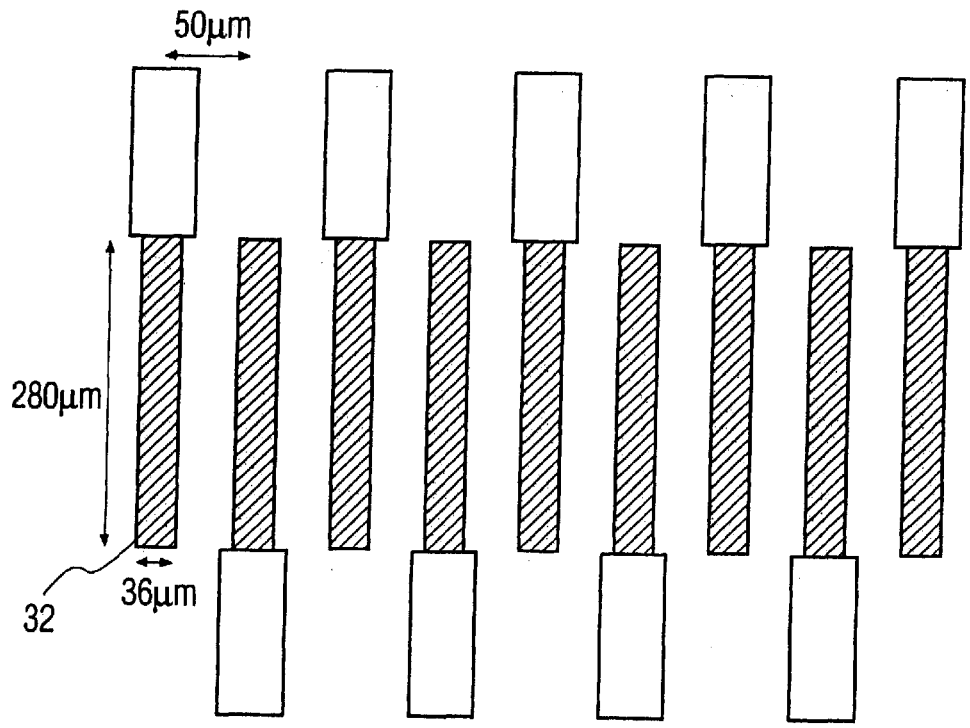
FIG. 4 is a schematic drawing of a 1-D linear array.

All three wafers were fabricated into 1-D (FIG. 4) and 2-D (FIG. 5) InGaAs PIN photodiodes with planar structures. Planar structures were used because they have been demonstrated to have high reliability. (S. R. Forrest, V. S. Ban, G. A. Gasparian, D. Gay, and G. H. Olsen, "Reliability of vapor-grown planar $In_{0.53}Ga_{0.47}As/InP$ p-i-n photodiodes with very high failure activation energy", IEEE Electron Device Lett. 9 (5), 217 (1988)). The 1-D array was made of pixels with 36 μm×280 μm diffusion regions 32. The 2-D arrays were 128×128 pixel array. The pixels were 40×40 μm 34 square diffusion regions on a 60 μm pitch.

Figures 5, 6:
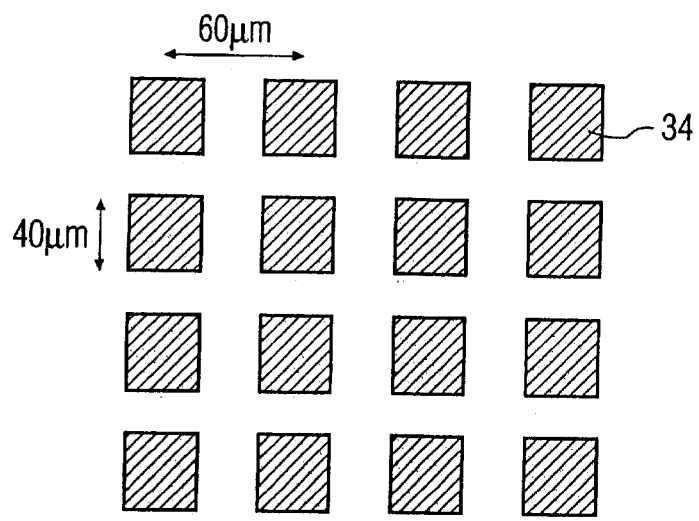
FIG. 5 is a schematic drawing of a 2-D focal plane array.
FIG. 6 is a table of data derived from FIG. 4 devices using material from FIG. 1, FIG. 2, and FIG. 3.

The wafers were processed in a single batch to eliminate process run variability. The 1-D (linear arrays) following processing were tested by two methods. The first test was measuring the I–V characteristics of an individual linear array pixel. The shunt resistance $R_0$ for these devices was measured between +/–10 μm. FIG. 6 shows a table of $R_0$ and dark current data ($I_d$ for the wafers). With these new structures, Sample A and Sample B, $R_0$ were significantly higher. The $5\times10^{15}$ $cm^{-3}$, Sample B, was 6 times higher than the control, Sample A, while the $5\times10^{16}$ $cm^{-3}$, Sample C, was 7 times higher than the control, FIG. 6, 36. The control wafer for this experiment was a factor of 3–4 times better than our typical lattice matched InGaAs wafer.

The onset of tunneling in these devices was at a significantly lower voltage than in a standard undoped device. The tunneling current in a high-speed p-i-n structure begins to onset at 35V. The new doped structures showed tunneling at much lower voltages typically around 3.5V for the Sample B while Sample C showed tunneling around 1V.

Another piece of the linear array was attached to a linear array multiplexer. The linear array multiplexer can be attached to 256 pixels. In this case the array was divided into 3 pieces where each doping structure was attached to nearly a ⅓ of the multiplexer. This allows all three structures to be tested at the same time and under the same conditions. The 1-D linear array incorporates a commercially available ROIC, which has a zero-bias capacitive transimpedance amplifier (CTIA) architecture. While nominally zero-bias, the actual voltage across each photodiode varies randomly in the range ±3 mV. The output from the ROIC is expressed as signal voltage. The transimpedance gain of the ROIC is 15 nV/electron. The dark current of the linear arrays is determined by measuring the output from the array for each pixel in the dark at various exposure times. A linear fit of signal versus integration time is calculated for each pixel, the slope of this fit is the dark current. All of the pixels were exposed to various uniform flat fields of light at a given integration time. This allowed an observation of the uniformity and linearity of response from these pixels.

Figure 7:
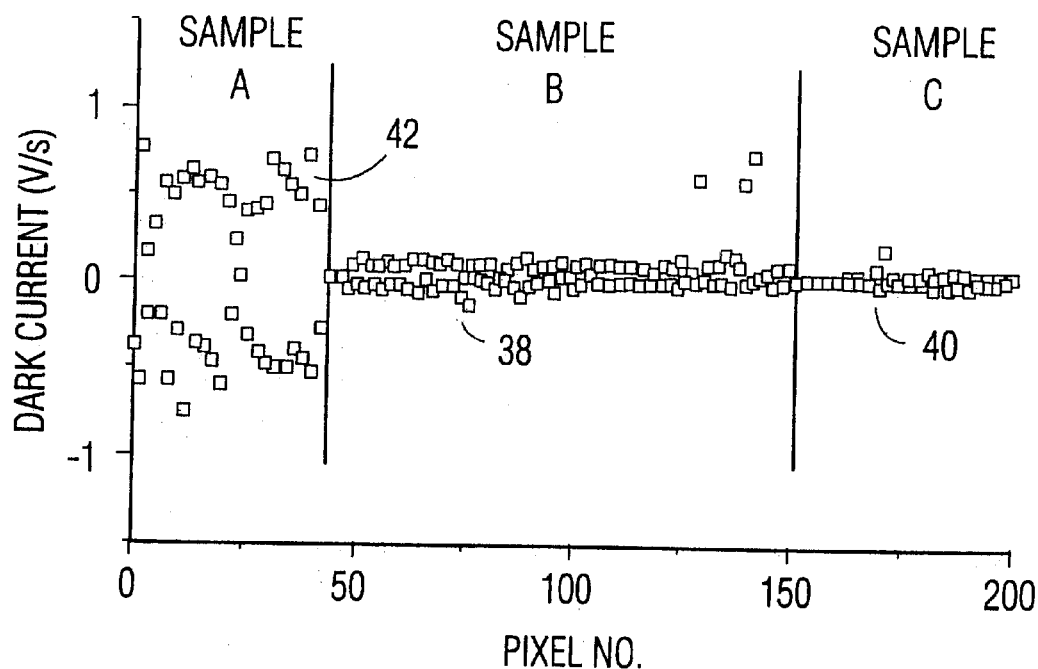
FIG. 7 is a curve showing the improved performance from a 1-D diode structure (linear array) utilizing the structure shown in FIG. 2 and FIG. 3 as opposed to FIG. 1.

FIG. 7 illustrates the structures with the doped active layers 38 and 40 exhibiting significantly lower dark current than the control structures 42. This is shown by the smaller scatter from 0 for 38 and 40 versus 42. The lower dark current translates directly into the ability to increase the amplifier gain and, thus, an increase in sensitivity. The photoresponse did not decrease in the various structures so that the increased shunt resistance (lower dark signal) translated directly into increased sensitivity.

The 2-D arrays were separately hybridized to three multiplexers, of the same type. The 128×128 InGaAs was hybridized to Rockwell's TCM 1700, a 128×128 GMOD architecture. The FPA is integrated to the Sensors Unlimited Inc. low noise 128×128 camera electronics. The 12 bit ADC (Analog to Digital Converter) was utilized in the camera to measure the amount of dark current and signal current from a given light source. Each FPA was inserted into a set of camera electronics. The ADC was matched to open pixels being zero and saturated pixels being 12 bits (2 volts) on the ADC. The reverse bias on the pixels is variable in this case 350 mV, 450 mV, and 900 mV were tested. This ROIC was not manufactured to run the devices at zero bias. The FPA was tested by capturing 16 frames in the dark and averaging them. A uniform flat field was put on the array using an integrating sphere. The light'source on the sphere was 1.55 μm LED. While using the light source 16 frames were also captured and averaged. The results of the bright field and dark field frames are in A/D counts for each pixel. The distribution of pixels were plotted in a histogram.

Figure 8:
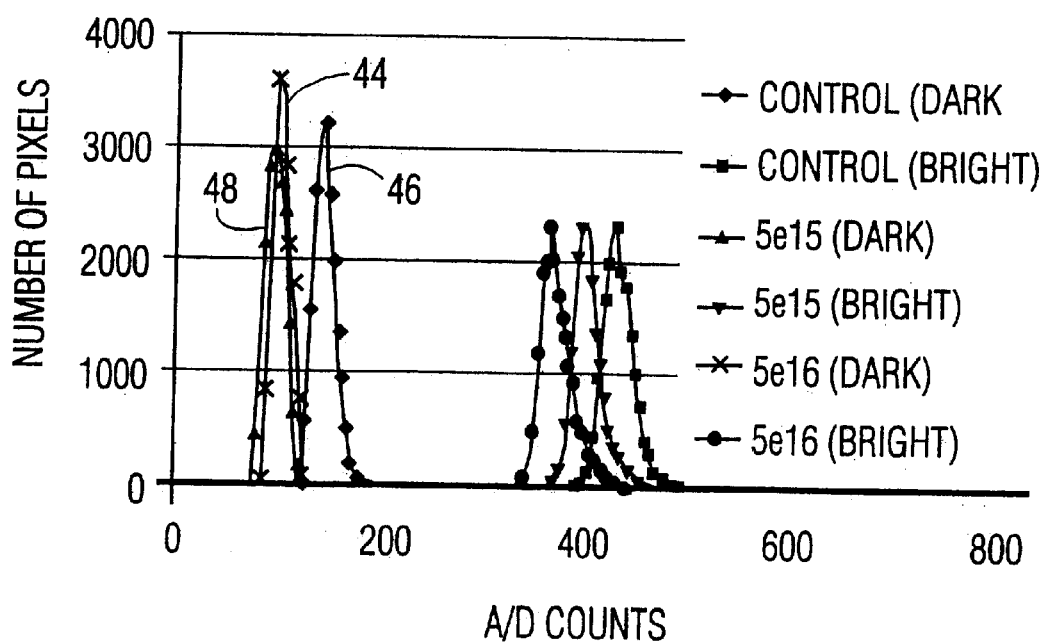
FIG. 8 is a curve showing the improved performance in a 2-D diode structure, focal plane array (FPA), utilizing the structure shown in FIG. 2 and FIG. 3, as opposed to FIG. 1.

The data indicates that the doped structures produce a camera with lower dark current at 450 mV, as shown in FIG. 8. The lower doping Sample B 42 appeared to have lower dark current in the camera than the Sample C 44 and the control sample, Sample A 46. The FIG. 2 sample produced lower dark current than both the FIG. 3 and the FIG. 1 sample at all operating voltages. The FIG. 2 sample was nearly a factor of 2 lower in dark current 48 than the control sample 46. Sample C would produce lower dark current than the FIG. 1 at smaller reverse biases, but it would not operate at the higher reverse bias value of 900 mV. This is most likely due to the fact the tunneling voltage of the Sample C was so low that the 900 mV may have been producing too much dark current.

Doping the absorption region is a significant novel advantage in fabricating p-i-n diodes because it lowers the dark current in these small area detectors which is contrary to prior art. The amount of doping is dependent on the amount of reverse bias placed on the device. The doped structures do lower the overall dark current at the biases used in these integrating detectors. This is contrary to the prior art in this context, which is to leave the absorption region undoped. The prior art generally stresses that it is desired to reduce the background doping in the absorption region as much as possible to lower the dark current.

Figure 9:
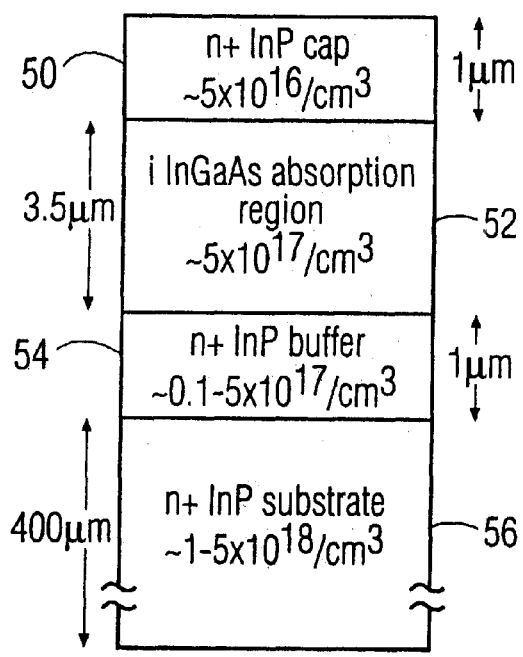
FIG. 9 illustrates a lattice matched p-i-n epitaxial structure before processing with the maximum intentional doping for improved performance, according to the preferred embodiment of the invention.
Figure 10:
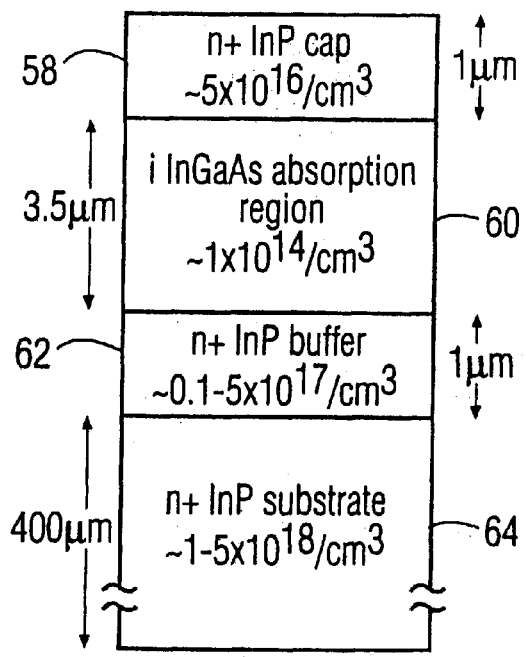
FIG. 10 illustrates a lattice matched p-i-n epitaxial structure before processing with the minimum intentional doping for improved performance, according to the preferred embodiment of the invention.

Due to the variation in the applied bias from various commercial ROICs there is a range of doping that will produce the lowest dark current. As seen in the above experiments the intentional doping of FIG. 3 produced very low dark current in the FIG. 4 1-D devices yet the results were not as positive in the FIG. 5 2-D devices where the FIG. 2 structure performed better. This difference was due to difference in the applied biases from the different ROICs. A range of intentional doping is then necessary depending on the amount of applied bias to the device. FIG. 9 illustrates the maximum intentional doping for improved performance based on our experiments. This structure has intentional doping of $5\times10^{17}/cm^3$ the absorption layer 52. This structure would be the optimum structure for achieving low dark currents when small biases are applied to the diode. FIG. 10 illustrates the minimum intentional doping for improved performance based on our experiments. This structure has intentional doping of $1\times10^{14}/cm^3$ the absorption layer 60. This structure would be the optimum structure for achieving low dark currents when larger bias voltages are applied to the diode.

Figure 11:
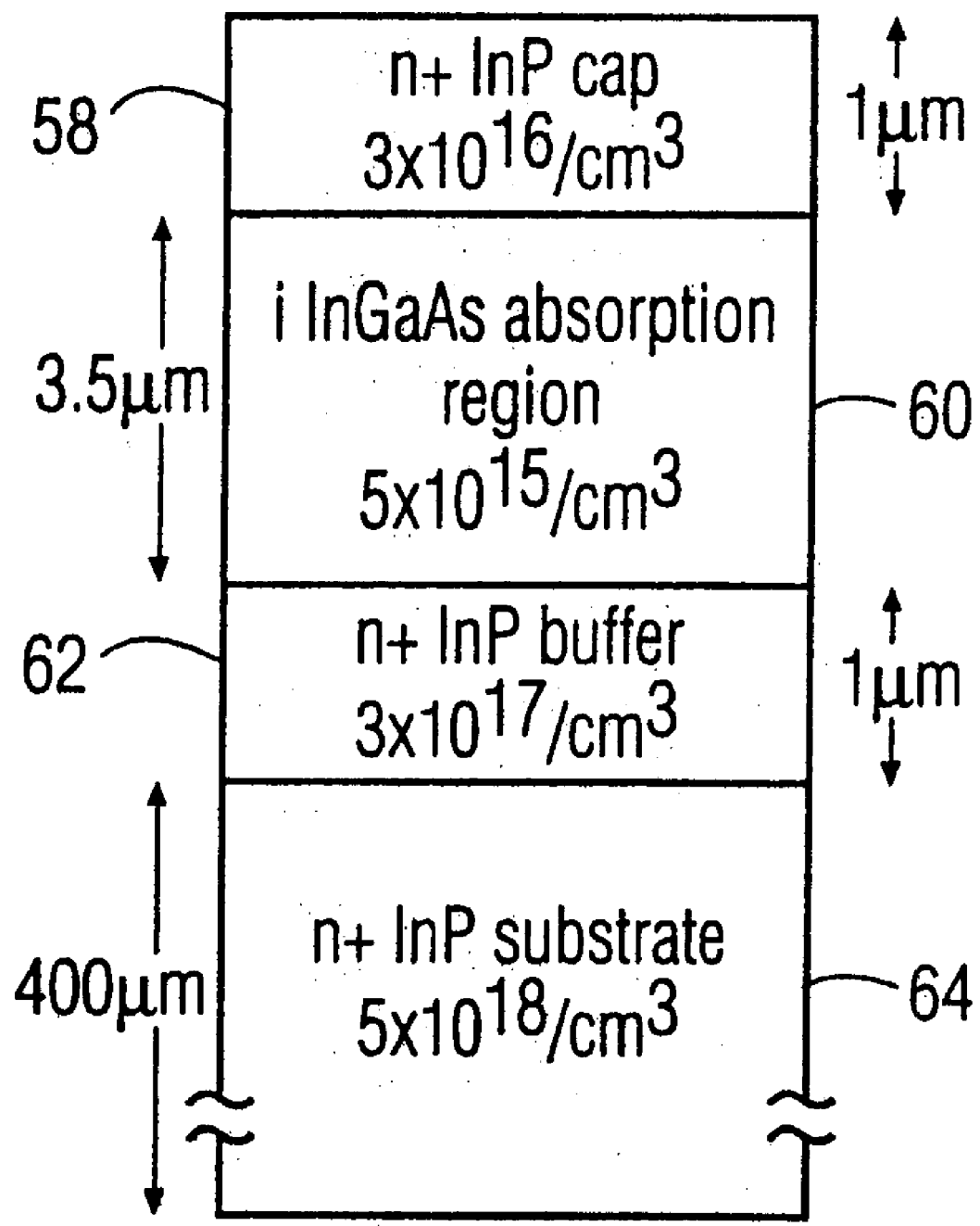
FIG. 11 illustrates the preferred embodiment for a typical lattice match p-i-n epitaxial structure before processing with doping valves that fall within the maximum and minimum range illustrated in FIGS. 9 and 10 respectively.

FIG. 11 illustrates the preferred embodiment for a typical lattice matched p-i-n epitaxial structure with doping values that fall within the maximum and minimum range illustrated in FIGS. 9 and 10 respectively.

While the invention has been described with reference to the preferred embodiment thereof it will be appreciated by those of ordinary skill in the art thus modification can be made to the structure and method steps of the invention without departing from the spirit as scope thereof.

What is claimed is:

1. A PIN photodiode apparatus having low leakage current for use in low voltage, low speed imaging array, said apparatus comprising:

a substrate of indium phosphide (InP) of an n+ type doping;

a buffer layer of InP with n+ doping grown on top of said InP substrate;

a lattice matched $In_{0.53}GA_{0.47}As$ absorption layer grown on top of said InP substrate and having a thickness of between 1 μm and 4 μm and which is intentionally doped n-type between $1\times10^{14}/cm^3$ and $5\times10^{17}/cm^3$; and, a top layer of InP which is doped n-type between $1\times10^{15}/cm^3$ to $2\times10^{19}/cm^3$ and which has a thickness between approximately 0.25 μm to 1.5 μm thick, wherein when said photodiode apparatus is employed in an array of said photodiodes, said array exhibits substantially greater uniformity of pixel-to-pixel response than arrays formed of PIN diodes without intentional doping in said absorption layer.

2. The photodiode apparatus of claim 1 wherein the dopant in the InGaAs absorption layer (18,28) is sulfur (S).

3. The photodiode apparatus of claim 1 wherein the dopant in the InGaAs absorption layer (18,28) is silicon (Si).

4. The photodiode apparatus of claim 1 wherein the dopant in the InGaAs absorption layer (18,28) is germanium (Ge).

5. The photodiode apparatus of claim 1 wherein the dopant in the InGaAs absorption layer (18,28) is selenium (Se).

6. The photodiode apparatus of claim 1 wherein the dopant in the InGaAs absorption layer (18,28) is tin (Sn).

7. The photodiode apparatus of claim 1 wherein the dopant in the InGaAs absorption layer (18,28) is a conventional n-type dopant for III–V semiconductors.

8. The photodiode apparatus of claim 1 wherein said photodiode is manufactured by a method selected from the group consisting of liquid epitaxy, molecular beam epitaxy, metal organic chemical vapor deposition and vapor phase epitaxy.

9. A PIN photodiode apparatus having low leakage current for use in a low voltage, low speed imaging array, said apparatus comprising:

at least one bottom layer of InP with n+ type doping; and, a lattice matched InGaAs absorption layer grown on the top of said InP bottom layer and which is intentionally doped with an n-type dopant in excess of residual background n-type concentration and wherein said intentional doping of said InGaAs absorption layer is in the range of $1\times10^{14}/cm^3$ and $5\times10^{17}/cm^3$, wherein when said photodiode apparatus is employed in an array of said photodiodes, said array exhibits substantially greater uniformity of pixel-to-pixel response than arrays formed of PIN photodiodes without intentionally doping in said absorption layer.

10. A PIN photodiode apparatus having low leakage current for use in low voltage, low speed imaging array, said apparatus comprising:

at least one bottom layer of InP with n+ type doping; and, a lattice matched InGaAs absorption layer grown on the top of said InP bottom layer and which is intentionally doped with an n-type dopant in excess of residual background n-type concentration and wherein said intentional doping of said InGaAs absorption layer is in the range of $1\times10^{14}/cm^3$ and $5\times10^{17}/cm^3$, wherein when said apparatus is employed in an array of said photodiodes, said array exhibits substantially greater uniformity of pixel-to-pixel response than arrays formed of PIN photodiodes without intentional doping in said absorption layer.

11. An imaging array apparatus comprised of low voltage, low speed PIN photodiodes having low leakage current, said photodiodes including:

at least one bottom layer of InP with n+ type doping; and, a lattice matched InGaAs absorption layer grown on the top of said InP bottom layer and which is intentionally doped with an n-type dopant in excess of residual background n-type concentration and wherein said intentional doping of said InGaAs absorption layer is in the range of $1\times10^{14}/cm^3$ and $5\times10^{17}/cm^3$, wherein said array exhibits substantially greater uniformity of pixel-to-pixel response than arrays formed of PIN diodes without intentional doping in said absorption layer.

* * * * *